(12) United States Patent
Imming et al.

(10) Patent No.: US 7,650,555 B2
(45) Date of Patent: Jan. 19, 2010

(54) METHOD AND APPARATUS FOR CHARACTERIZING COMPONENTS OF A DEVICE UNDER TEST USING ON-CHIP TRACE LOGIC ANALYZER

(75) Inventors: Kerry Christopher Imming, Rochester, MN (US); Resham Rajendra Kulkarni, Austin, TX (US); To Dieu Liang, Round Rock, TX (US); Sarah Sabra Pettengill, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 355 days.

(21) Appl. No.: 11/460,471

(22) Filed: Jul. 27, 2006

(65) Prior Publication Data

US 2008/0028269 A1 Jan. 31, 2008

(51) Int. Cl.
*G06F 11/00* (2006.01)
*G01R 31/28* (2006.01)

(52) U.S. Cl. .............................. 714/738; 714/9; 714/25; 714/31; 714/39; 714/43; 714/47; 714/56; 714/712; 714/734

(58) Field of Classification Search ........................ None
See application file for complete search history.

(56) References Cited

U.S. PATENT DOCUMENTS

| | | | |
|---|---|---|---|
| 4,703,448 A | 10/1987 | Muething, Jr. | |
| 5,325,309 A | 6/1994 | Halaviati et al. | |
| 6,397,354 B1 | 5/2002 | Ertekin | |
| 6,523,136 B1 | 2/2003 | Higashida | |
| 6,553,529 B1 * | 4/2003 | Reichert | 714/738 |
| 6,557,119 B1 | 4/2003 | Edwards et al. | |
| 6,834,360 B2 | 12/2004 | Corti et al. | |
| 6,834,364 B2 * | 12/2004 | Krech et al. | 714/45 |
| 6,937,961 B2 | 8/2005 | Cabral et al. | |
| 6,964,001 B2 | 11/2005 | Dervisoglu et al. | |
| 7,007,205 B1 | 2/2006 | Yeager et al. | |
| 7,437,638 B2 * | 10/2008 | Parker | 714/727 |
| 2003/0063693 A1 * | 4/2003 | Heath | 375/343 |
| 2004/0221201 A1 | 11/2004 | Serof | |
| 2006/0015775 A1 * | 1/2006 | Benavides et al. | 714/30 |

(Continued)

OTHER PUBLICATIONS

Agilent 1—"Agilent Parbert 81250 43G, Version 1.6", Agilent Prod. Overview ( © 2001).

(Continued)

*Primary Examiner*—Kevin L Ellis
*Assistant Examiner*—Guerrier Merant
(74) *Attorney, Agent, or Firm*—Matt Talpis; Mark P Kahler

(57) ABSTRACT

A test system is disclosed wherein a device under test (DUT) includes a trace logic analyzer (TLA) that receives and stores test data. The test system includes both a master tester and a slave tester. The slave tester operates at a high speed data rate substantially faster than that of the master tester. The master tester instructs the TLA to monitor data that the DUT receives from the slave tester to detect a predetermined data pattern within the data. The slave tester transmits data including the predetermined data pattern to the DUT. The DUT receives the data. When the TLA in the DUT detects the predetermined data pattern in the received data, the TLA stores that data pattern as a stored data pattern. The master tester retrieves the stored data pattern and compares the stored data pattern with the original predetermined data pattern. If the master tester determines that the stored data pattern is the same as the original predetermined data pattern, then the master tester generates a pass result. Otherwise, the master tester generates a fail result. In one embodiment, the DUT includes multiple receivers and the system determines a pass/fail rating on a per receiver basis.

14 Claims, 3 Drawing Sheets

U.S. PATENT DOCUMENTS

2007/0168808 A1* 7/2007 Ong .......................... 714/731

OTHER PUBLICATIONS

Agilent 2—"Agilent Parbert 81250, Version 5.68", Agilent Prod. Overview ( © 2003, 2004).

Leatherman—"Debugging Processor-based FPGA Designs, FGGA & SASIC Journal" (2004).

Stahleder—"Integrated Debug Tools for Embedded Systems with PGFA based IP", Lauterbach (downloaded from www.nohau.se on Apr. 10, 2006).

Tektronix—"The XYZs of Logic Analyzers", Tektronix Primer ( © 2001).

Williams—"A Painless Guide to CRC Error Detection Algorithms" ( © 1993).

* cited by examiner

METHOD AND APPARATUS FOR CHARACTERIZING COMPONENTS OF A DEVICE UNDER TEST USING ON-CHIP TRACE LOGIC ANALYZER

TECHNICAL FIELD OF THE INVENTION

The disclosures herein relate generally to test systems, and more particularly, to test systems for high speed logic circuits.

BACKGROUND

The term "device under test" or DUT commonly refers to a logic circuit that a test system analyzes or tests to determine the electrical characteristics thereof. For example, a DUT such as a processor may include multiple data receivers that an engineer, technician or other user desires to characterize. The process of characterizing circuit structures such as data receivers includes testing those structures to determine compliance with acceptable operating parameters. These operating parameters may include the input signal shape, signal amplitude, signal width, frequency and response time.

A processor DUT may include data transmitters as well as data receivers. The data transmitters transmit information from the DUT to circuits external to the DUT, while the data receivers receive data from circuits external to the DUT. As the frequencies that a DUT employs become higher and higher with the advance of technology, the testing of circuit structures such as data receivers becomes more difficult. "External I/O wrap" is one technique for characterizing the data receivers of a DUT. The external I/O wrap technique involves the data transmitters of the DUT generating a high speed data pattern that loops back to the data receivers of the DUT. Unfortunately, with the I/O wrap technique the tester can not determine if a data error originates with one of the data transmitters or one of the data receivers. "Internal I/O wrap" is another technique for characterizing the data receivers of the DUT. The internal I/O wrap methodology involves sending a data pattern into the data receivers of the DUT and looping the data pattern inside the DUT to the data transmitters. The data transmitters then transmit the data pattern. A tester couples to the data transmitters to check for errors. Unfortunately, once again a tester can not determine if a data error originates from one of the data receivers or one of the data transmitters.

A combined external wrap/cyclic redundancy check (CRC) approach provides yet another technique for characterizing DUT components such as DUT data receivers and data transmitters. In this technique, the data transmitters send a high speed data pattern together with a CRC code that the data receivers receive. A tester then tests the received data pattern. Unfortunately, with this approach you can generally not determine which particular receiver of the data receivers, or which particular transmitter of the data transmitters, failed. Some DUT systems may employ a trace logic analyzer for debugging purposes.

What is needed is a method and apparatus that tests a DUT with a high speed data pattern and that addresses the above problems.

SUMMARY

Accordingly, in one embodiment, a method is disclosed for testing a device under test (DUT). The method includes programming a master tester and a slave tester with a first predefined data pattern including a plurality of bits. The method also includes transmitting, by the slave tester, a high speed data signal including the first predefined data pattern to a plurality of receivers in a DUT. The transmitting of the high speed data signal is in response to a trigger signal initiated by the master tester. The method further includes monitoring, by a trace logic analyzer (TLA) integrated in the DUT, the high speed data signal transmitted by the slave tester. The TLA monitors the high speed data signal to detect the first predefined data pattern therein, thus providing a detected received data pattern. The method still further includes storing, by the TLA, the detected received data pattern. The method also includes comparing, by the master tester, the detected received data pattern to the first predefined data pattern. The method further includes generating, by the master tester, a pass result if the detected received data pattern is the same as the first predefined data pattern. Otherwise, the master tester generates a fail result.

In another embodiment, a test system is disclosed that includes a device under test (DUT) with an integrated a trace logic analyzer (TLA). The DUT also includes a plurality of receivers coupled to the TLA. A master tester, coupled to the DUT, instructs the TLA to monitor for a first predefined data pattern. The test system also includes a slave tester coupled to the master tester and the plurality of receivers of the DUT. The slave tester stores the first predefined data pattern. The slave tester also transmits a high speed data signal including the first predefined data pattern to the plurality of receivers. The TLA stores the first predefined data pattern when it receives the first predefined data pattern in the high speed data signal from the slave tester, thus providing a stored received data pattern. The master tester retrieves the stored received data pattern from the TLA as a retrieved data pattern. The master tester generates a pass result if the retrieved data pattern is the same as the first predefined data pattern and otherwise generates a fail result.

BRIEF DESCRIPTION OF THE DRAWINGS

The appended drawings illustrate only exemplary embodiments of the invention and therefore do not limit its scope because the inventive concepts lend themselves to other equally effective embodiments.

DETAILED DESCRIPTION

Figure 1:
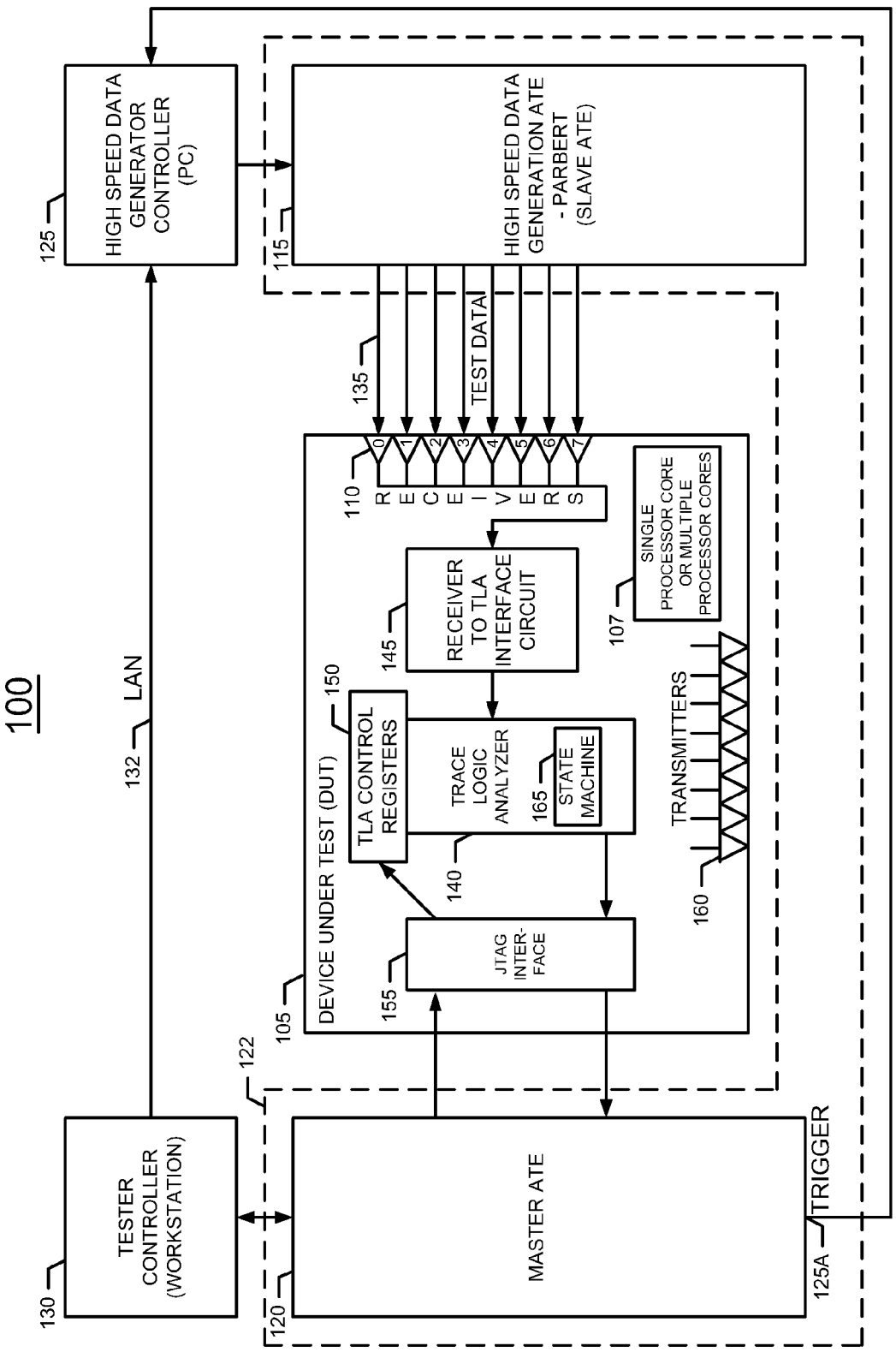
FIG. 1 shows a block diagram of the disclosed test system.

FIG. 1 shows a test system 100 that tests a device under test (DUT) 105 to determine if a component 110, such as a high speed I/O port, in DUT 105 functions properly. In one embodiment, DUT 105 includes a processor having a processor core 107 or multiple processor cores 107. However, DUT 105 may include virtually any digital logic circuit or other electrical circuit that requires testing of a component 110 in an integrated circuit. In this particular example, DUT 105 includes 8 data receivers 110-0, 110-1 . . . 110-7 that receive test data. These 8 receivers together form a high speed I/O port, namely an input port. Each data receiver couples to a respective input pin (not shown) on an integrated circuit die that DUT 105 employs. In this embodiment, test system 100 characterizes or tests receivers 110 to assure their functionality.

The term "ATE" refers to automated test equipment, namely a programmable tester that controls the testing of a DUT. A high speed data generation ATE 115 couples to data receivers 110-0, 110-1 . . . 110-7 to provide test data thereto. In one embodiment, high speed ATE 115 is a parallel bit error rate tester or PARBERT. One ATE found acceptable for use as high speed ATE 115 is the Agilent Model 81250A. High speed ATE 115 provides the 8 receivers 110 with one byte of test data at a time in a high speed test data stream as discussed in more detail below. An engineer, technician or other user may desire to determine if receiver failure occurs on a per receiver or per pin basis in response to the high speed test data. For example, test system 100 determines not only that a receiver error occurs, but also which particular receiver of the 8 receivers actually fails. The term "high speed" as it applies to ATEs and other test circuitry herein generally refers to frequencies in the gigabits per second range, although the testing methodologies taught herein apply to lower frequencies and higher frequencies as well.

Test system 100 includes a master ATE 120 that couples to ATE 115 via a high speed data generator controller 125. In this manner, master ATE 120 controls when high speed ATE 115 commences sending predetermined test pattern data to DUT 105. In this capacity, high speed ATE 115 acts as a slave ATE for master ATE 120. One ATE found acceptable for use as the master ATE 120 is the Agilent Model 93000. The operating frequency of high speed ATE 115 typically is substantially higher than the operating frequency of master ATE 120. For example, in one representative embodiment, high speed ATE 115 operates at a frequency of 3.2 gigabits per second, while master ATE 120 operates at a frequency of approximately 2 megabits per second or 2 MHz. Master ATE 120 and high speed slave ATE 115 are both tester devices. In one embodiment, test system 100 combines master ATE 120 and slave ATE 115 in a common tester unit 122. In other words, the high speed slave ATE 115 is not necessarily physically separate from master ATE 120. In such an embodiment, common tester unit 122 includes the functionality of both ATE 115 and ATE 120.

In more detail, a tester controller 130 couples to master ATE 120 to provide a user with an apparatus to control the operation of master ATE 120 and the remainder of test system 100. In one embodiment, test system 100 employs a workstation computer system as the tester controller 130. A local area network (LAN) 132 couples tester controller 130 to data generator controller 125. LAN 132 provides a communication path between tester controller 130 and high speed data generator controller 125 that enables the writing and reading of high speed signal settings between these devices. LAN 132 allows master ATE 120 to program high speed ATE 115 with different settings such as voltage drive levels, termination information, frequency and drive delays. Master ATE includes a trigger output 125A that couples to high speed data generator controller 125 as shown in FIG. 1. Master ATE 120 sends a trigger signal to high speed data generator controller 125. In response, high speed data generator controller 125 instructs high speed ATE 115 to transmit a predetermined high speed data pattern on an 8 conductor test bus 135 to the 8 respective receivers 110-0, 110-1 . . . 110-7 of DUT 105. A user may instruct high speed ATE 115 with the particular high speed data pattern to send to DUT 105. The user also instructs master ATE 120 with an expected data pattern that is the same data pattern as the high speed data pattern that ATE 115 sends to DUT 105. Because ATE 115 does not start sending data signals to DUT 105 until ATE 115 receives the trigger signal, ATE 115 acts as a high speed slave device to master ATE 120.

Device under test (DUT) 105 is a semiconductor device such as a microprocessor in one representative embodiment. DUT 105 includes an integrated trace logic analyzer (TLA) 140 that stores test data that it acquires from receivers 110. In one embodiment, TLA 140 is "on-chip" because DUT 105 integrates TLA 140 on the same integrated circuit chip as processor cores 107, receivers 110 and other DUT components. A trace logic analyzer (TLA) is typically a logic analyzer built into a processor for hardware debugging purposes. A TLA may include event state machine logic with pattern matching capabilities. The TLA may also include memory arrays to store data. The processor in the DUT provides a way to bus critical signals to a trace array through support logic that it includes. DUT 105 further includes a receiver to TLA interface circuit 145 that conveys high speed test data from receivers 110 to TLA 140. Interface circuit 145 includes support logic that controls and communicates with different portions of a DUT microprocessor 105 including receivers 110. DUT 105 also includes TLA control registers 150 that couple to TLA 140 to provide control and setup information thereto. DUT 105 includes a JTAG interface 155 that couples master ATE 120 to TLA 140 and TLA control registers 150. JTAG interface 155 allows master ATE 120 to program the TLA control registers 150 and further allows TLA 140 to communicate stored test data back to master ATE 120. DUT 105 also includes control transmitters 160 that enable DUT 105 to communicate with external circuitry (not shown).

In one embodiment, master ATE 120 sends JTAG commands to TLA 140 to program TLA 140 to monitor for a particular data pattern from receivers 110. Each of the eight receivers 110 corresponds to a respective data input pin (not shown) on DUT 105. A user or operator of test system 100 instructs master ATE 120 with respect to the particular data pattern that TLA 140 should seek while monitoring the high speed data stream that DUT 105 receives from high speed ATE 115. Master ATE 120 thus stores a known or expected data pattern that TLA 140 should seek. Before TLA 140 starts monitoring for high speed data patterns from receivers 110 master ATE 120 performs setup operations on DUT 105. During these setup operations, master ATE 120 uses the JTAG interface 155 to communicate setup information to TLA control registers 150. The setup information may include a particular high speed data pattern that TLA 140 should seek until it detects the same. Master ATE 120 thus programs the TLA control registers 150 to cause TLA 140 to look for a predetermined data pattern when TLA 140 later receives test data from high speed ATE 115. Master ATE 120 instructs DUT 105 to run a power-on sequence to initialize DUT 150 before DUT 150 accepts high speed test data from ATE 115. Thus, using JTAG commands, master ATE 120 programs DUT 105 so that DUT 105 is ready to receive data from high speed ATE 115.

After test system 100 initializes DUT 105 and instructs TLA 140 with the particular data pattern to seek, master ATE 120 sends a trigger signal from trigger output 125A to high speed data generator controller 125. This trigger signal instructs controller 125 to command high speed ATE 115 to commence sending high speed pattern data to DUT 105. High speed ATE 115 thus acts as a slave ATE to master ATE 120. In response to the trigger signal, high speed ATE 115 starts sending high speed data patterns to receivers 110 in DUT 105. In this particular example, the user or test operator employs test system 100 to characterize the 8 receivers of receiver group 110. In one embodiment, all 8 receivers of the receiver group 110 receive high speed pattern data. Receivers 110 send the received data to trace logic analyzer (TLA) 140. TLA 140 monitors the received high speed data for the predetermined data pattern. Once TLA 140 detects the predetermined data pattern among the received data, TLA 140 commences storing the received data pattern and starts to fill up to its capacity with captured data. In one embodiment, TLA 140 fills up once with the captured high speed data pattern and then stops accepting data. In other words, TLA 140 stops accepting new data once it receives and detects the predetermined data pattern so that new data does not overwrite the captured predetermined data pattern. Moreover, TLA stops accepting data once it is full of captured data to avoid overwriting the already captured data.

Once TLA 140 captures the predetermined data pattern, master ATE 120 employs JTAG commands to serially read the captured predetermined data pattern from TLA 140 to master ATE 120 via JTAG interface 155. Master ATE 120 then compares the captured predetermined data pattern with the expected data pattern. Once ATE 120 performs the comparison, ATE 120 logs a "pass" result if the comparison is true. Alternatively, ATE 120 logs a "fail" result if a miscompare exists between the captured data and the expected data. In one embodiment, master ATE 120 reads all bits from the captured high speed data pattern of TLA 140, however particular bits may be of interest. When master ATE 120 reads captured bits from TLA 140 serially over JTAG interface 155, each captured bit corresponds to particular data that a particular receiver 110-0,1 10-2, . . . 110-7 receives. Master ATE 120 compares particular captured bits with corresponding particular expected bits, to provide pass/fail results on a per receiver basis. If desirable, master ATE may perform a comparison to provide pass/fail results for one receiver at a time.

Figure 2:
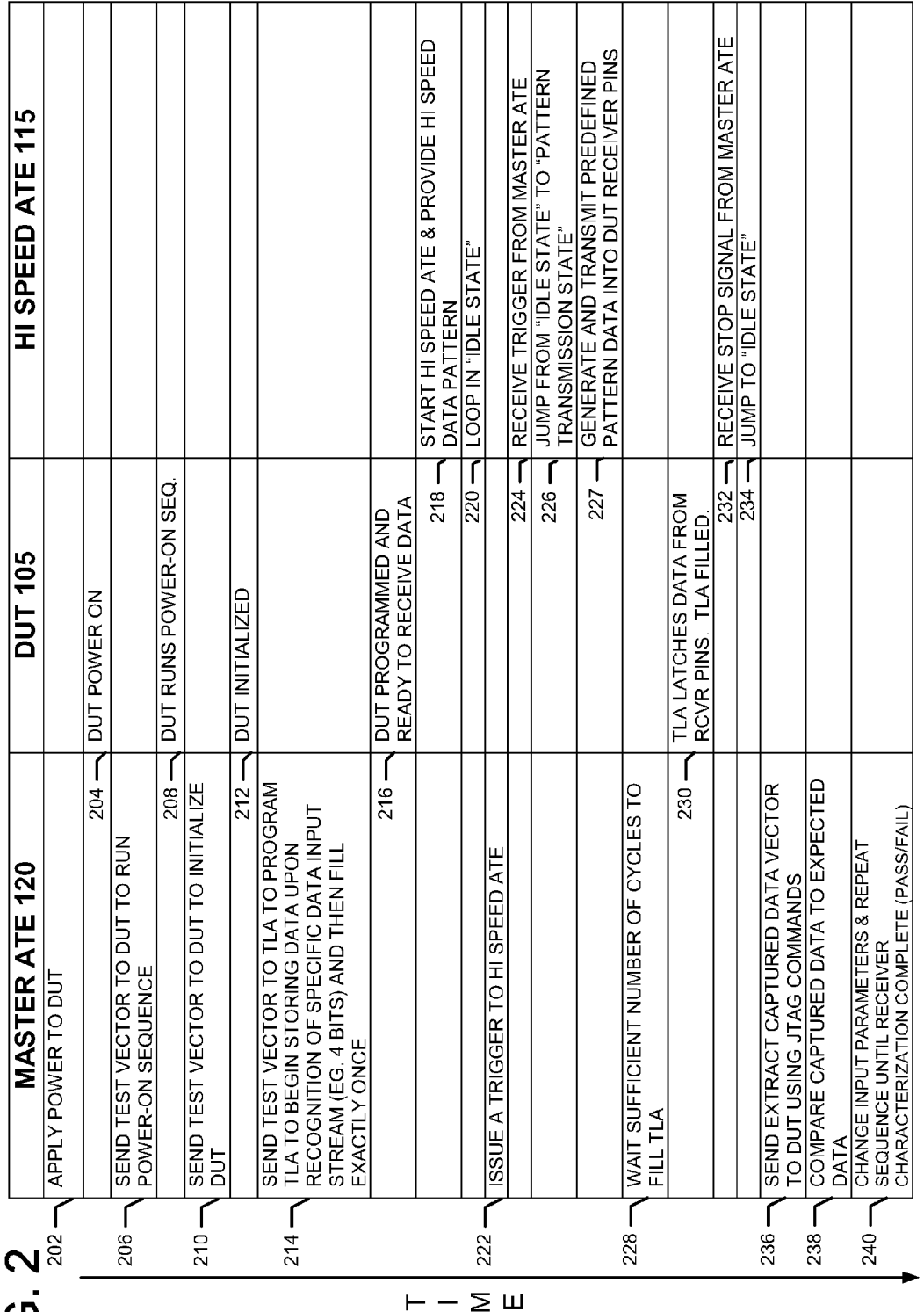
FIG. 2 shows a flowchart that describes the test methodology that the test system of FIG. 1 employs.

FIG. 2 is a flow chart that shows steps that test system 100 performs along with the particular component of system 100 that performs each step. The leftmost column of FIG. 2 shows steps that master ATE 120 performs. The center column shows steps that DUT 105 performs. Finally, the rightmost column shows steps that high speed ATE 115 performs. The test process commences when test system 100 applies power to DUT 105, as per block 202. In response, DUT 105 powers on, as per block 204. Master ATE 120 then sends a test vector to DUT 105 instructing the DUT to assume a powered-up and ready-to-initialize state, as per block 206. In response, after powering up DUT 105 runs a power-on sequence that places DUT 105 in a powered-up and ready-to-initialize state, as per block 208. Next, master ATE 120 sends a test vector to DUT 105 that instructs DUT 105 to initialize, as per block 210. In response, DUT 105 initializes itself, as per block 212.

Master ATE 120 then sends a test vector to TLA 140 of DUT 105 that programs the TLA to begin storing high speed pattern data from high speed ATE 115 upon recognition of specific predetermined pattern data in the received data, as per block 214. In response to receiving the test vector of block 214, DUT 105 executes the instructions of the test vector to monitor received data from the high speed ATE 115 to detect the predetermined data pattern, as per block 216. DUT 105 is thus ready to receive data from the high speed ATE 115.

In one embodiment, the user or operator starts high speed ATE 115, as per block 218. The user or operator provides or inputs the desired predefined data pattern to ATE 115. The predefined high speed data pattern now in ATE 115 is the same predefined data pattern for which master ATE 120 programmed DUT 105 to search in blocks 214 and 216. Test system 100 then instructs high speed ATE 115 to loop in an idle state, as per block 220. While in the idle state, high speed ATE waits for a trigger signal to instruct it to begin sending high speed data including the predefined data pattern to the receivers 110 of DUT 105.

Master ATE 120 sends a trigger signal to high speed ATE 115 via controller 125, as per block 222. High speed ATE 115 receives the trigger signal, as per block 224. In response, high speed ATE 115 changes from the idle state to an active data pattern transmission state, as per block 226. Once in the active pattern transmission state, high speed ATE 115 generates and transmits to DUT 105 high speed data including the predefined high speed data pattern, as per block 227. The user or operator takes step to assure that the data that high speed ATE 115 transmits to the DUT includes the same predefined data pattern that master ATE 120 programs TLA 140 to monitor and seek out. The pattern data that ATE 115 transmits to DUT 105 may include data other than the predefined high speed data pattern as long as it at least includes the predefined high speed data pattern.

TLA 140 monitors the incoming pattern data from receivers 110 to determine if the received data includes the predefined data pattern that master ATE 115 programmed it to seek. When TLA 140 detects the predefined data pattern among the incoming pattern data, TLA 140 waits a sufficient number of cycles to allow TLA 140 to fill with the predefined data pattern, as per block 228. Once TLA 140 captures the predefined data pattern, then the TLA latches the predefined data pattern therein, as per block 230. In one embodiment, TLA 140 recognizes the programmed or predefined high speed pattern data for which it searches, and in response to such recognition or detection, stores or fills itself with the received predefined high speed data pattern exactly once. In this manner, TLA 140 avoids overwriting the recognized pattern data with other data.

Next, master ATE 120 sends a stop signal to the high speed ATE 115 and high speed ATE 115 receives this stop signal, as per block 232. In response to receiving the stop signal, high speed ATE 115 jumps back to the idle state, as per block 234. Once back in the idle state, ATE 115 again waits for a trigger signal. With the received predefined data pattern from high speed ATE 115 now stored in TLA 140, master ATE 120 sends a vector data extract instruction to TLA 140, as per block 236. The vector data extract instruction employs a JTAG command to tell TLA 140 to send the captured predetermined data pattern to master ATE 120. ATE 120 then compares the captured predetermined data pattern from TLA 140 with the expected data pattern stored in ATE 120, as per block 238. If the captured predetermined data pattern is identical to the expected data pattern, then master ATE 120 so notifies the user or operator with a pass result that master ATE 120 or tester controller 130 displays to the user or operator. If the captured data pattern is not identical to the expected data pattern, in this event the master ATE 120 also so notifies the user with a fail result that master ATE 120 or tester controller 130 displays to the user. The user then changes the input parameters and repeats the steps described above until test system 100 completely characterizes receivers 110, as per block 240. In one embodiment, test system 100 informs the user of receiver failure by providing a pass/fail reading for each of the receivers of receiver group 110.

Master ATE 120 reads out the contents of TLA 140 serially. Each data bit that master ATE 120 reads from TLA 140 corresponds to data that a particular receiver receives. To examine test results on a per receiver basis, in one embodiment master ATE 120 compares received data bits from a particular selected receiver to the expected data pattern for that particular selected receiver. To characterize each receiver, test system 100 sweeps or varies receiver parameters such as input voltage swing, input voltage common mode and drive delay for the receivers. Then system 100 compares the actual data pattern that a particular receiver receives with the corresponding expected data pattern for that receiver. For example, high speed slave ATE 115 varies the voltage swing of test data that ATE 115 supplies to the receivers on bus 135. More particularly, high speed slave ATE 115 sets the voltage swing of test data on bus 135 to a first voltage swing value. A particular receiver, for example receiver 110-0, receives test data exhibiting the first voltage swing value. TLA 140 captures and stores a data pattern corresponding to the test data exhibiting the first voltage swing values. Captured data is another term for the data that TLA 140 stores. Master ATE 120 retrieves the captured data for the particular receiver 110-0 from TLA 140. Master ATE 120 compares the captured data with the expected data for the particular receiver 110-0. Master ATE 120 then issues a pass/fail result for the current scenario wherein receiver 110-0 receives data exhibiting the first voltage swing value. Continuing with the process of characterizing receiver 110-0, high speed slave ATE 115 changes the voltage swing to a second voltage swing value by reducing the voltage swing on receiver 110-0 by a predetermined number of millivolts in this particular example. TLA 140 then captures data corresponding to receiver 110-0. Master ATE 120 then retrieves the captured data for the particular receiver 110-0 from TLA 140. Master ATE 120 compares the captured data with the expected data for receiver 110-0 for the second voltage swing value. Master ATE 120 then issues a pass/fail result for the current scenario wherein receiver 110-0 receives data exhibiting the second voltage swing value. High speed slave ATE 115 may change the voltage swing of the test data that it provides to receiver 110-0 and repeat the comparison process for other voltage swing values until test system 100 fully characterizes receiver 110-0 with respect to the input data voltage swing parameter. ATE 115 may repeat this testing and characterization process for receivers other than 110-0. ATE 115 may also carry out this testing and characterization process for other test parameters to which it subjects receivers 110.

Figure 3:
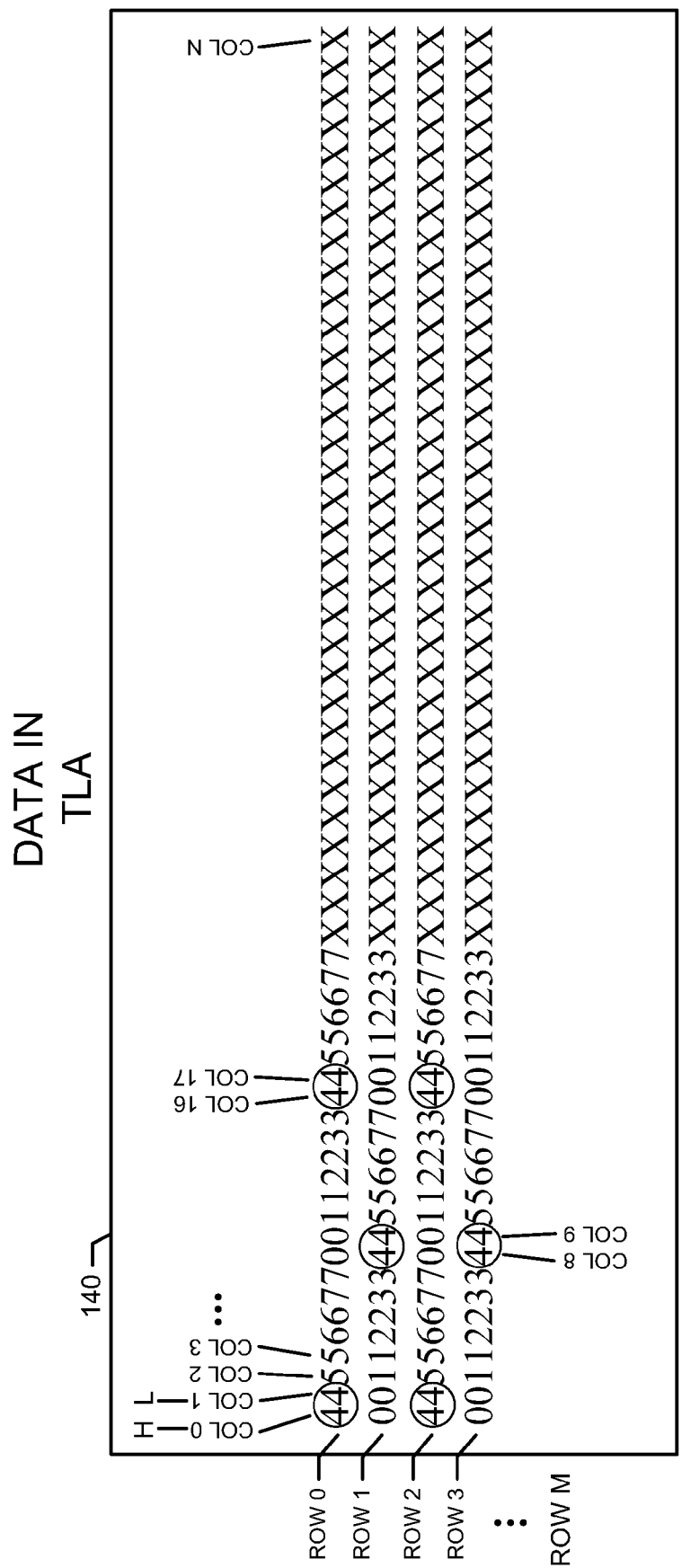
FIG. 3 shows a representative received pattern data that a trace logic analyzer in a device under test stores in one embodiment of the disclosed test system.

FIG. 3 shows representative data that DUT 105 receives from high speed ATE 115 and stores in its TLA 140. Receivers 110-0, 110-1 . . . 110-7 together receive one byte (1 byte=8 bits) at a time. TLA 140 stores the received data in TLA 140 using the arrangement that FIG. 3 depicts. Each bit of the received byte corresponds to a different one of receivers 110. For example, receiver 110-0 receives bit 0 of the byte, receiver 110-1 receives bit 1 of the byte, . . . and receiver 110-7 receives bit 7 of the byte thus completing reception of the full byte. Each of the 8 receivers couples to a respective input pin (not shown) in DUT 105. In other words, receiver 110 receives a byte of data at a time, namely 8 bits, one bit of which corresponds to each receiver.

TLA 140 includes a programmable logic state machine 165 with pattern compare capabilities. The TLA state machine 165 includes a programmable feature that enables the TLA state machine to exhibit different states depending on the data that it sees. In one embodiment, TLA state machine 165 includes programming that instructs TLA 140 not to collect data while it looks for a particular data pattern. Once TLA 140 sees the particular data pattern, state machine 165 changes states to a state wherein TLA 140 starts filling with data from the receivers 110-0, 110-1, . . . 110-7.

TLA 140 forms an array of M rows and N columns of which FIG. 3 depicts 4 representative rows, namely ROW 0, ROW 1, ROW 2 and ROW 3, for example purposes. TLA 140 also includes representative columns COL 0, COL 1, COL 2, COL 3 . . . . In actual practice, TLA 140 may include many more rows than the 4 illustrated rows depending on the particular application. The arrangement of FIG. 3 illustrates one way that TLA 140 fills with data. In one embodiment, TLA 140 fills with data the same way each time high speed slave ATE 115 sends data to receivers 110. Each receiver corresponds to a different pin. To provide per receiver visibility, TLA control registers 150 include format information that indicates the format that TLA 140 employs to read these pins. TLA 140 is viewable as a 2 dimensional array of data cells or locations wherein ROW 0 is the first row and ROW M is the last row. TLA 140 also includes columns wherein COL 0 is the first column and COL N is the last column. Using this convention, TLA [row][column] represents the format of each data cell of the TLA. For example, locations TLA [0][0] and TLA [0][1] store the data bits associated with receiver 110-4 as the numeral 4 indicates in each of those locations in FIG. 3. (For example, see the leftmost entries within the circle at the beginning of ROW 0.) Similarly, locations TLA [0][2] and TLA [0][3] store the data bits associated with receiver 110-5 as the 5 in each of those locations indicates. In this particular embodiment, TLA 140 stores data with respect to a particular receiver in pairs as for example the 44 and 55 designations indicate in FIG. 3. In addition to such pairing, other groupings are possible such as single data bits, triple data bits, quadruple data bits and so forth.

To view the data bits relating to a particular selected receiver such as 110-4, master ATE 120 retrieves data bits corresponding to locations TLA [0][0] and TLA [0][1]. To view the data bits relating to a selected receiver such as 110-5, master ATE 120 retrieves data bits corresponding to locations TLA [0][2] and TLA [0][3]. In this manner, test system 100 achieves per receiver visibility. To achieve this per receiver visibility, master ATE 120 or other control structure in test system 100 must know which TLA locations associate with each particular receiver. To view all the data in TLA 140 that relates to receiver 110-4, master ATE 120 reads out all captured data bits stored in TLA 140 and effectively places "don't cares" (X's) on all data bits except data bits from TLA locations relating to receiver 110-4. In other words, master ATE 120 treats all TLA locations as "don't cares" (X's) except TLA[0][0], TLA[0][1], TLA[0][16], TLA[0][17], TLA[1][8], TLA[1][9], TLA[2][0], TLA[2][1], TLA[2][16], TLA[2][17], TLA[3][8], TLA[3][9], etc. If the data that high speed slave ATE 115 sent to receiver 110-4 exhibited the data pattern 10101010, then in a passing test case the captured data for TLA[0][0] should equal 1, the captured data for TLA[0][1] should equal 0, the captured data for TLA[0][16] should equal 1, the captured data for TLA[0][17] should equal 0, and so forth through the remainder of TLA 140. Master ATE 120 includes an expected data pattern of H (for compare high or 1) followed by L (for compare low or 0).

In one embodiment, TLA 140 triggers on a subset of all bits that it receives, namely trigger bits. Once TLA 140 determines a match on these trigger bits, the TLA receives and stores the bits that it receives to fill the TLA. The bits that TLA 140 thus captures or stores may include the trigger bits and subsequent bits that need not necessarily be part of a pattern. Corruption of data reception may occur any time after pattern match occurs and capture of data into the TLA commences.

The foregoing discloses a test system that employs a device under test (DUT) including a trace logic analyzer (TLA). In one embodiment, the test system provides per receiver visibility among multiple data receivers to provide a pass/fail result for each receiver. The TLA inside the DUT stores characterization data and makes the characterization data available for analysis to an ATE such as ATE 120. While in the described embodiment the TLA stores received data from multiple receivers for the described test purposes, such as performance characterizing purposes, the TLA is also useable for debugging processor core 107.

Modifications and alternative embodiments of this invention will be apparent to those skilled in the art in view of this description of the invention. Accordingly, this description teaches those skilled in the art the manner of carrying out the invention and is intended to be construed as illustrative only. The forms of the invention shown and described constitute the present embodiments. Persons skilled in the art may make various changes in the shape, size and arrangement of parts. For example, persons skilled in the art may substitute equivalent elements for the elements illustrated and described here. Moreover, persons skilled in the art after having the benefit of this description of the invention may use certain features of the invention independently of the use of other features, without departing from the scope of the invention.

What is claimed is:

1. A method of testing a device under test (DUT), the method comprising:
programming a master tester and a slave tester with a first predefined data pattern including a plurality of bits;
transmitting, by the slave tester, a high speed data signal including the first predefined data pattern to a plurality of receivers in a device under test (DUT), the transmitting being in response to a trigger signal initiated by the master tester;
monitoring, by a trace logic analyzer (TLA) in the DUT, the high speed data signal transmitted by the slave tester to detect the first predefined data pattern therein, thus providing a detected received data pattern;
storing, by the TLA, the detected received data pattern;
transmitting, by the DUT, the detected received data pattern to the master tester, the detected received data pattern providing test data to the master tester on a per receiver basis;
comparing, by the master tester, the detected received data pattern to the first predefined data pattern to determine if a particular receiver is functioning properly; and
generating, by the master tester a pass result for the particular receiver if the comparing step indicates that the particular receiver is functioning properly and otherwise generating a fail result for the particular receiver.

2. The method of claim 1, wherein the step of transmitting by the DUT comprises transmitting, by the TLA, the detected received data pattern to the master tester.

3. The method of claim 1, further comprising transmitting, by the master tester, the trigger signal to the slave tester to instruct the slave tester to transmit the high speed data signal.

4. The method of claim 3, further comprising waiting, by the slave tester, in an idle state until the master tester transmits the trigger signal.

5. The method of claim 1, wherein the storing step includes terminating storing of received data after the TLA stores the detected received data pattern.

6. The method of claim 1, wherein the slave tester exhibits a data rate greater than a data rate of the master tester.

7. The method of claim 1, wherein both the master tester and the slave tester are combined in a tester unit.

8. A method of testing a device under test (DUT), the method comprising:
programming a master tester with a first predefined data pattern including a plurality of bits;
programming a slave tester with the first predefined data pattern, the slave tester being capable of transmitting data signals exhibiting a higher data rate than the master tester;
transmitting, by the master tester, a command signal to a trace logic analyzer (TLA) in the DUT, the command signal instructing the TLA to monitor for the first predefined data pattern;
transmitting, by the master tester, a trigger signal to the slave tester;
transmitting, by the slave tester in response to the trigger signal, pattern data including the first predefined data pattern to the DUT, the DUT including a plurality of data receivers that are coupled to the TLA;
receiving, by the plurality of data receivers, pattern data from the slave tester thus providing received pattern data;
monitoring, by the TLA, the received pattern data to detect the first predefined data pattern, thus providing a detected received data pattern;
storing, by the TLA, the detected received data pattern when the TLA detects the first predefined data pattern in the received pattern data;
transmitting, by the DUT, the detected received data pattern to the master tester, the detected received data pattern providing test data to the master tester on a per receiver basis;
comparing, by the master tester, the detected received data pattern to the first predefined data pattern to determine if a particular receiver is functioning properly; and
generating, by the master tester a pass result for the particular receiver if the comparing step indicates that the particular receiver is functioning properly and otherwise generating a fail result for the particular receiver.

9. The method of claim 8, wherein the step of transmitting by the DUT comprises transmitting, by the TLA, the detected received data pattern to the master tester.

10. A test system comprising:
a device under test (DUT) including a trace logic analyzer (TLA) and a plurality of receivers coupled to the TLA;
a master tester, coupled to the DUT, the master tester being programmed with a first predefined data pattern including a plurality of bits;
a slave tester, coupled to the master tester and the plurality of receivers of the DUT, the slave tester being programmed with the first predefined data pattern by the master tester, wherein the slave tester transmits a high speed data signal including the first predefined data pattern to the plurality of receivers of the DUT in response to a trigger signal initiated by the master tester;
wherein the TLA in the DUT monitors the high speed data signal transmitted by the slave tester to detect the first predefined data pattern therein, thus providing a detected received data pattern, the TLA storing the detected received data pattern;
wherein the DUT transmits the detected received data pattern to the master tester, the detected received data pattern providing test data to the master tester on a per receiver basis; and
wherein the master detector compares the detected received data pattern to the first predefined data pattern to provide a comparison that indicates if a particular receiver is functioning properly, and the master detector generates a pass result for the particular receiver if the comparison indicates that the particular receiver is functioning properly and otherwise generates a fail result for the particular receiver.

11. The test system of claim 10, wherein the high speed data signal of the slave tester exhibits a data rate greater than a data rate of the master tester.

12. The test system of claim 10, wherein the DUT comprises one of a single core processor and a multi-core processor.

13. The test system of claim 10, further comprising a tester unit that includes both the master tester and the slave tester.

14. The test system of claim 10, wherein the master tester comprises first automated test equipment (ATE) and the slave tester comprises second automated test equipment (ATE).

* * * * *